United States Patent [19]

Lin

[11] Patent Number: 5,472,814
[45] Date of Patent: Dec. 5, 1995

[54] ORTHOGONALLY SEPARATED PHASE SHIFTED AND UNPHASE SHIFTED MASK PATTERNS FOR IMAGE IMPROVEMENT

[75] Inventor: Burn J. Lin, Tampa, Fla.

[73] Assignee: International Business Machines Corporation, Armonk, N.Y.

[21] Appl. No.: 340,995

[22] Filed: Nov. 17, 1994

[51] Int. Cl.⁶ ............................................. G03F 9/00
[52] U.S. Cl. .................... 430/5; 430/323; 430/324; 430/394
[58] Field of Search .................. 430/5, 323, 324, 430/394

[56] References Cited

U.S. PATENT DOCUMENTS

| | | |
|---|---|---|
| 5,153,083 | 10/1993 | Garofalo et al. . |
| 5,246,800 | 9/1993 | Muray . |
| 5,260,152 | 11/1993 | Shimizu et al. . |
| 5,268,244 | 12/1993 | Yoo ............................... 430/5 |
| 5,273,850 | 12/1993 | Lee et al. . |
| 5,275,895 | 1/1994 | Kusunose . |
| 5,279,896 | 1/1994 | Tokunagu et al. .................. 428/355 |
| 5,286,581 | 2/1994 | Lee . |
| 5,288,569 | 2/1994 | Lin . |
| 5,391,441 | 2/1995 | Imai et al. ....................... 430/5 |

OTHER PUBLICATIONS

Marc D. Levenson et al., "Improving Resolution in Photolithography with a Phase–Shifting Mask," I.E.E.E. Transactions on Electron Devices, vol. ED–29, No. 12, Dec. 1982.

*Primary Examiner*—S. Rosasco
*Attorney, Agent, or Firm*—Perman & Green

[57] ABSTRACT

A structure and fabrication method for an alternating-element phase-shifting mask (Alt PSM) wherein all the mask pattern components extending in a first direction, such as the x direction are formed on a first mask substrate and all the mask pattern components extending in a second direction orthogonal to the first direction, such as the y direction, are formed on a second mask substrate. The two mask substrates are either combined together in a single mask for a single exposure step on a wafer, or separate exposures may be made through each mask and superimposed on a single wafer.

20 Claims, 5 Drawing Sheets

SUB-PATTERN A

SUB-PATTERN B

ORTHOGONALLY SEPARATED PHASE SHIFTED AND UNPHASE SHIFTED MASK PATTERNS FOR IMAGE IMPROVEMENT

FIELD OF THE INVENTION

This invention relates to masks for lithography and more particularly to phase-shift masks for use in photolithography.

DESCRIPTION OF THE RELATED ART

In photolithography, masks are employed to expose a pattern upon a work piece. As manufacturing requirements call for exposure of patterns with smaller and smaller dimensions, it is becoming necessary to employ techniques which permit enhancement of the current performance of the process of photolithography.

At present, small features or small geometric patterns are created by using conventional optical photolithography. Typically, optical photolithography is achieved by projecting or transmitting light through a pattern made of optically opaque areas and optically clear areas on a mask. The optically opaque areas of the pattern block the light, thereby casting shadows and creating dark areas, while the optically clear areas allow the light to pass, thereby creating light areas. Once the light areas and the dark areas for formed, they are projected onto and through a lens and subsequently onto a substrate. However, because of increased semiconductor device complexity which results in increased pattern complexity, and increased pattern packing density on the mask, distance between any two opaque areas has decreased. By decreasing the distances between the opaque areas, small apertures are formed which diffract the light that passes through the apertures. The diffracted light results in effects that tend to spread or to bend the light as it passes so that the space between the two opaque areas is not resolved, therefore, making diffraction a severe limiting factor for optical photolithography.

A conventional method of dealing with diffraction effect in optical photolithography is achieved by using a phase-shift mask, which replaces the previously discussed mask. Generally, with light being thought of as a wave, phase-shifting is a change in timing of a shift in wave form of a regular sinusoidal pattern of light waves that propagate through a transparent material. Typically, phase-shifting is achieved by passing light through areas of a transparent material of either differing thicknesses or through materials with different refractive indexes, or both, thereby changing the phase or the periodic pattern of the light wave. Phase-shift masks reduce diffraction effects by combining both diffracted light and phase-shifted diffracted light so that constructive and destructive interference takes place favorably.

An example of one type of phase-shift system, the alternating element phase shifting mask, as well as a detailed description of theory is disclosed in Marc D. Levenson et al., "Improving Resolution in Photolithography with a Phase-Shifting Mask," I.E.E.E. Transactions on Electron Devices, Vol. ED-29, No. 12, Dec. 1982 which is hereby incorporated herein by reference.

Other references that provide background information relative to phase shift mask technology are as follows.

U.S. Pat. No. 5,153,083 issued Oct. 6, 1992 to Garofalo et al. entitled "Method of Making Phase-Shifting Lithographic Masks" discloses a method wherein phase-shifting (two-optical-level) masks are manufactured by a self-aligned technique in which after first level trenches in the mask have been formed, second level trenches therein are formed by patterning an electron resist overlying the mask in such a manner that the edges of the patterned resist can be located anywhere within the first level trenches, whereby the need for precise alignment of the resist patterning for the second level trenches is avoided.

U.S. Pat. No. 5,246,800 issued Sept. 21, 1993 to Murray entitled DISCRETE PHASE SHIFT MASK WRITING describes a method and apparatus for photolithographically fabricating features on a very large scale integrated circuit wafer by use of a phase shift mask defining discrete regions. This overcomes the problems of intensity nulls at the junction of region formed by portions of the mask having opposite phase. The mask includes a transition region defining three phases which are assigned to pixels in the transition region, such that the phase assignment of the pixels is synthesized from an algorithm taking into account optical resolution and depth of focus. Each pixel is assigned one of three discrete phases, which thereby creates a transition region simulating a ramp between the two regions of opposite phases, such that intensity variation of the optical image corresponding to the transition region is minimized.

U.S. Pat. No. 5,260,152 issued Nov. 9, 1993 to Shimizu et al entitled PHASE SHIFTING MASK AND METHOD OF MAKING SAME discloses a method for manufacture of such a phase shifting mask comprises the steps of forming a light shielding layer on a substrate; forming a photoresist on the light shielding layer; patterning the photoresist to form a resist pattern; providing an opening in the light shielding layer by the use of the resist pattern as a mask, thereby forming a light shielding pattern; etching the substrate anisotropically to form a phase shifting segment; side etching the light shielding pattern to form a light shielding region; and removing the resist pattern.

U.S. Pat. No. 5,268,244 issued Dec. 7, 1993 to Yoo entitled SELF-ALIGNED PHASE SHIFTER FORMATION discloses a process of fabricating the phase-shifting photomask that includes forming on a substrate a patterned metal layer having vertical and horizontal surfaces. A substantially uniform phase-shifting material is deposited over the patterned metal layer surfaces. The phase-shifting material anisotropically etched to substantially remove the material from the horizontal surfaces and to substantially leave in p/ace the material on the vertical or sidewall surfaces of metal layer to form phase shifter side-wall structures on the vertical or sidewall surfaces to form the phase shifting photomask without use of photoresist lithography in the formation of the phase shifter sidewall structures.

In U.S. Pat. No. 5,273,850 issued Dec. 28, 1993 to Lee et al entitled CHROMELESS PHASE-SHIFT MASK AND METHOD where a method is provided for forming a right angle on a chromeless phase-shift mask. A first phase shift element and a second phase shift element are positioned at a ninety degree angle, on the chromeless phase shift mask, wherein there is a predetermined space between the first and second phase-shift elements. The space between the phase shift elements eliminates hot spot formation that causes unintentional exposure of the semiconductor substrate.

U.S. Pat. No. 5,275,894 issued Jan. 4, 1994 to Tanabe entitled PHASE SHIFTING MASK described a phase shifting mask that includes an opaque layer having three adjacent apertures which comprise a predetermined pattern, and at least two phase shifters each having a different shift amount. At least two of the apertures are covered with the phase shifters so that a phase difference between each two adjacent apertures is approximately 120° C. (⅓ λ). Therefore, light intensity at a medial area between each two adjacent aperture is decreased in comparison with independent lights passing through the apertures.

U.S. Pat. No. 5,275,895 issued Jan. 4, 1994 to Kusunose entitled METHOD OF MANUFACTURING PHASE-SHIFTING MASK discloses a light-shielding pattern including light-shielding regions and an aperture therebetween is formed on a substrate. The substrate and the light-shielding pattern are then coated with conductive film the conductive film is thereafter patterned, defining a conductive pattern. Next, a phase-shifting film and a resist film are deposited in this order on the substrate, the light-shielding pattern and the conductive pattern following this, a light beam is illuminated toward the bottom surface of the substrate and developed, thereby defining a resist pattern. The phase-shifting film is thereafter selectively etched with the resist pattern as an etching mask. As a result, a phase-shifter is obtained. Thus, the conductive pattern not only acts as an etching stopper but also prevents the substrate from getting charged. Hence, a phase-shifting mask is manufactured accurately.

U.S. Pat. No. 5,275,896 issued Jan. 4, 1994 to Garofalo et al entitled SINGLE-ALIGNMENT LEVEL LITHO-GRAPHIC TECHNIQUE FOR ACHIEVING SELF ALIGNED FEATURES described a phase shifting lithographic mask that is made by a procedure involving only a single patterned electron, ion, or photon beam bombardment of a resist layer. The bombardment is arranged to produce three kinds of regions in the resist: no dosage, low dosage, and high dosage. These three regions in the resist are then utilized—in conjunction with an ordinary wet development step followed by either a silylation or an optical flooding technique, and thereafter by another ordinary wet development step followed by either a silylation or an optical flooding technique and thereafter by another ordinary wet development step—to pattern the resist layer and thereby to enable forming, by dry or wet etching, an underlying double layer consisting of a patterned opaque layer and a patterned transparent phase-shifting layer, the phase shifting layer being located on, or being part of, a transparent substrate.

In U.S. Pat. No. 5,286,581 issued Feb. 15, 1994 to Lee entitled PHASE SHIFT MASK AND METHOD FOR MAKING wherein a method is provided for fabricating a phase shift mask and mask plate is provided. A semitransparent layer is deposited onto the mask plate. The semitransparent layer is then patterned into a predetermined geometric pattern. The patterning of the semitransparent layer is then continued into the mask plate for a predetermined distance thus providing a phase shift mask.

U.S. Pat. No. 5,288,569 issued Feb. 22, 1994 to Lin entitled FEATURE BIASSING AND ABSORPTIVE PHASE SHIFTING TECHNIQUES TO IMPROVE OPTICAL PROJECTION IMAGING discloses phase shifting masks where feature biassing is used to improve the exposure latitude and depth of focus of an optical projection imaging system. Making the phase shifters absorptive facilitates a phase shifting mask system for arbitrary layouts. Combining phase shifters of different levels of absorption further enhance the improvements. Even more enhancement can be gained by combining biassing with absorption levels.

This U.S. Pat. No. 5,288,569 also discloses another prior art technique which is incorporated into the present invention as being a type of phase shifted mask embodiment with which the method of the present invention can be employed. The technique is referred to as the rim phase shifted mask technique and relates to a substrate carrying an absorber which carries a phase shifter beyond the absorber. The rim phase shifted mask technique applies to all features on any mask.

SUMMARY OF THE INVENTION

An object of the present invention is to provide a lithographic exposure process using the superposition of two masks derived from separating a given mask into orthogonal components.

Another object of the present invention is to provide an exposure process using two orthogonally separated lithographic masks that are phase shifted alternately.

A further object of the present invention is to provide an exposure process using two masks phase-shifted by the rim PSM technique.

Still another object of the present invention is to provide an exposure process using two masks phase-shifted by the Att PSM technique.

A still further object of the present invention is to provide an exposure process using one mask phase shifted by one PSM approach and a second mask phase shift by a different PSM approach.

BRIEF DESCRIPTION OF THE DRAWINGS

The above set forth and other features of the invention are made more apparent in the ensuing Detailed Description of the Invention when read in conjunction with the attached drawings, wherein.

DESCRIPTION OF THE PREFERRED EMBODIMENTS

An alternating (Alt) element phase-shifting mask normally includes a substantially transparent substrate composed, for example, of quartz. Phase shifting material such as silicon nitride or other suitable transparent material such as oxides or oxynitrides on the substrate serve to provide a phase shift to radiation passed through it. In the alternating element phase-shifting mask discrete non-phase shifting components are disposed alternatively adjacent to discrete phase shifting components.

An attenuate (Att) phase-shifting mask contains discrete layers of absorbers, composed for example of chromium disposed on the mask substrate. Hybrid attenuate-unattenuated phase shifting masks (Att-Utt PSM) can also be combined with alternate element phase-shifting masks (Alt PSM) to provide a Alt-Att-Utt PSM.

Another type of phase-shifting mask is a hybrid of the Att PSM and the aforesaid rim PSM disclosed in U.S. Pat. No. 5,288,569. In this hybrid mask the unshifted elements are each decorated by a rim that has the same transmission as the Att PSM by shifting the radian by a different amount (i.e. 3 $\pi$ radians). The shape and size of the rim is much less critical than the rim used in the mask known as the Rim PSM discussed in aforesaid U.S. Pat. No. 5,288,569. In this configuration, each of the closely packed elements is surrounded by an attenuated phase shifter; whereas, it is also shifted with respect to its neighbor.

Figure 1:
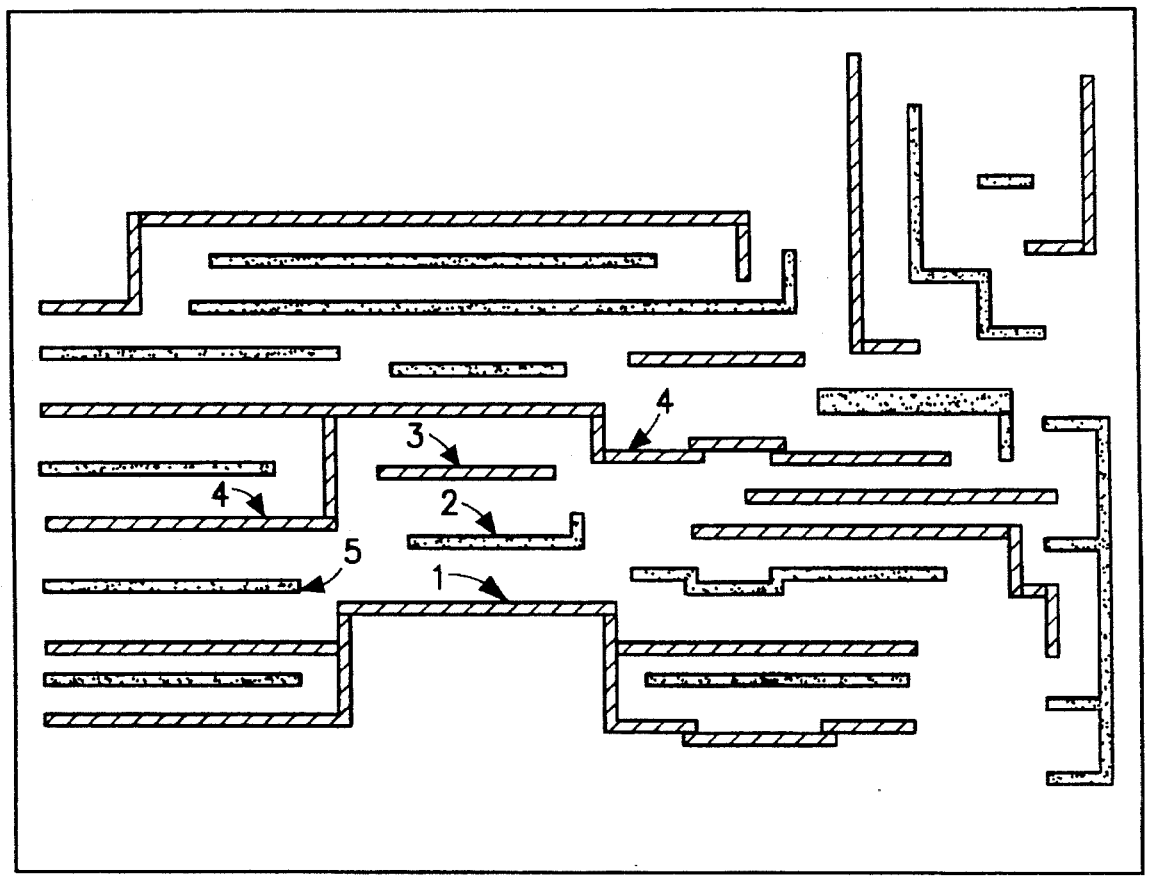
FIG. 1 is a schematic illustration of the alternately phase shifted components of a phase shifted mask.

The alternating-element phase shifting mask is very effective in improving the exposure latitude and the depth of focus for closely-packed small patterns as demonstrated in the aforesaid Levenson publication. However, alternately phase shifting all the elements is possible only in a strictly one-dimensional layout. It is not difficult to find conflicts in a two-dimensional layout such as shown in FIG. 1., which is a gate-level pattern disclosed in the publication by A.S. Wong, D. M. Newmark, J.B. Rolfson, R.J. Whiting, A.R. Neureutherm, Proceedings IEDM, Dec. 1991. Referring to FIG. 1, the elements 1, 2, and 3 as well as 4 and 5 satisfy the requirement of alternation but there is a violation, that is, there is no alternation of phase between elements 3 and 4. If the phase of element 4 is shifted to create a phase shift between 3 and 4, the phase shift between 4 and 5 will disappear. Similar violations are found in many other places of the figure.

The aforesaid violations are greatly reduced or minimized in the present invention by performing the alternation of the patterns in the x and Y (orthogonal) directions separately.

This alternation is carried out by the step of separating all the patterns into X oriented patterns and Y oriented patterns. The X oriented patterns are placed by lithographic exposure techniques on a first mask and the Y oriented patterns are similarly placed by lithographic exposure on a second mask. The wavelengths used for the exposure radiation can be taken from any part of the spectrum between 0.1 nanometers and 1 nanometers.

Then each mask is alternately shifted and recombined by super positioning the X exposures and the Y exposures on the wafer.

Figure 2:
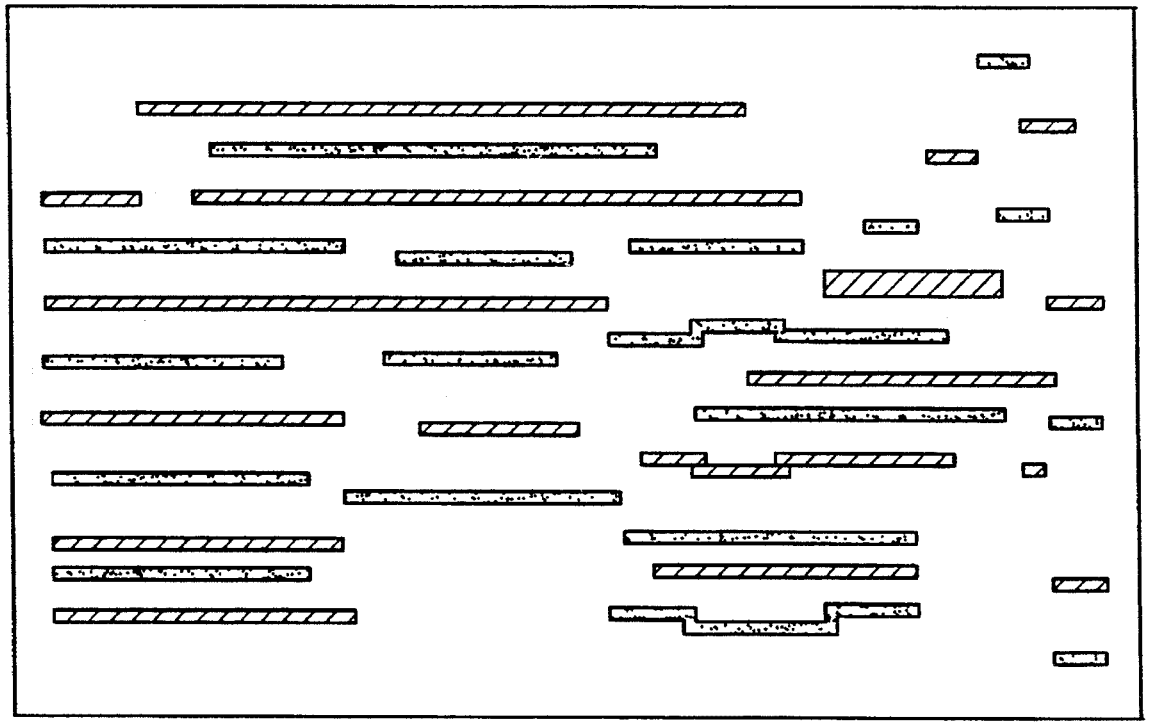
FIG. 2 is a schematic illustration of the alternately phase shifted X-direction components of the phase shifted mask of FIG. 1.

Referring to FIG. 2, the X oriented patterns of the patterns of FIG. 1 are shown disposed on a first mask. The X oriented patterns of the first mask of FIG. 2 are alternately phase shifted components. The components shown in stippled form are unshifted openings in the chrome mask and the components depicted in cross-hatch form are $\pi$-shifted openings in the chrome.

Figure 3:
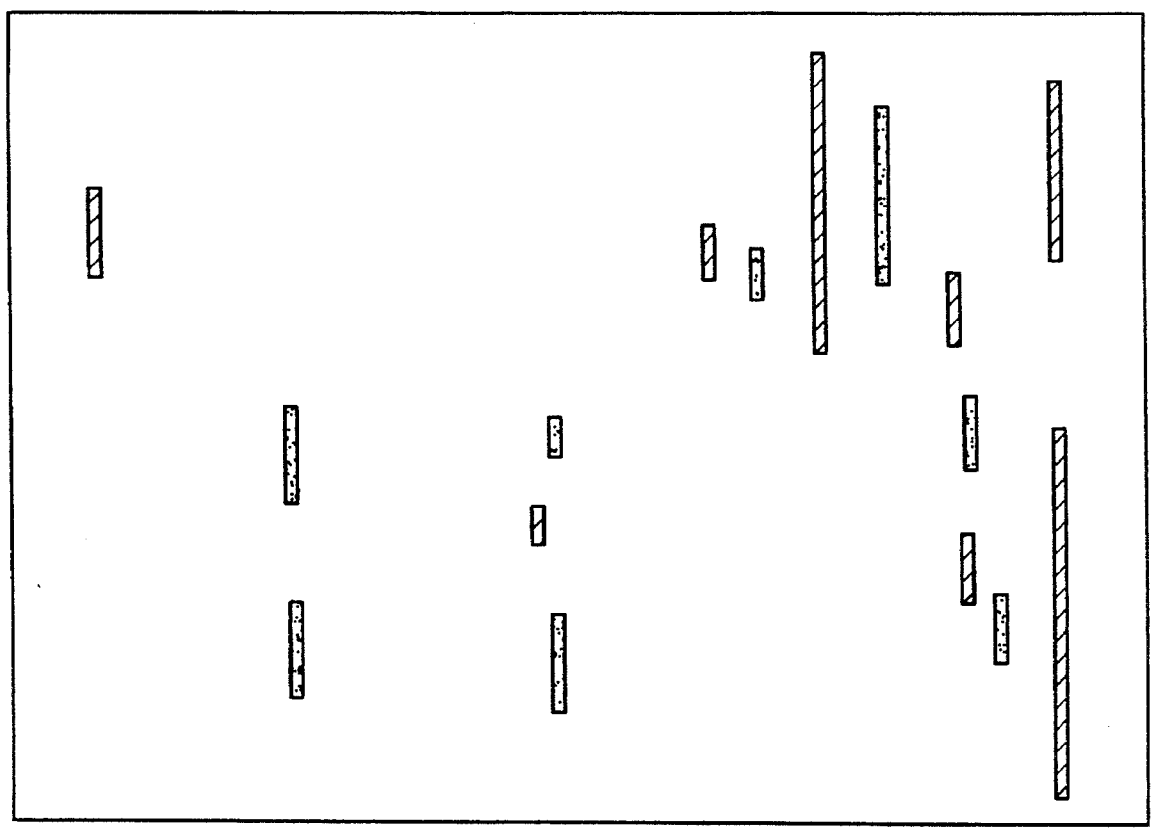
FIG. 3 is a schematic illustration of the alternately phase shifted y-direction components of the phase shifted mask of FIG. 1.

Likewise, FIG. 3 illustrates a second mask containing the alternately phase shifted Y oriented patterns of FIG. 1 with the stippled components being unshifted openings in the chrome and the cross-hatched components being the $\pi$-shifted openings in the chrome.

In the mask patterns of FIGS. 2 and 3 there are no alternating conflicts in the Y direction for the X components shown in FIG. 2, and there are no alternating conflicts in the X direction for the Y components shown in FIG. 3.

Figure 9:
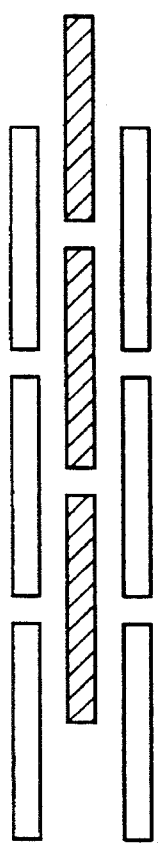
FIGS. 9 and 10 are schematic illustrations showing how third and fourth substrates can be used to solve conflicts at feature ends of patterns.
Figure 10:
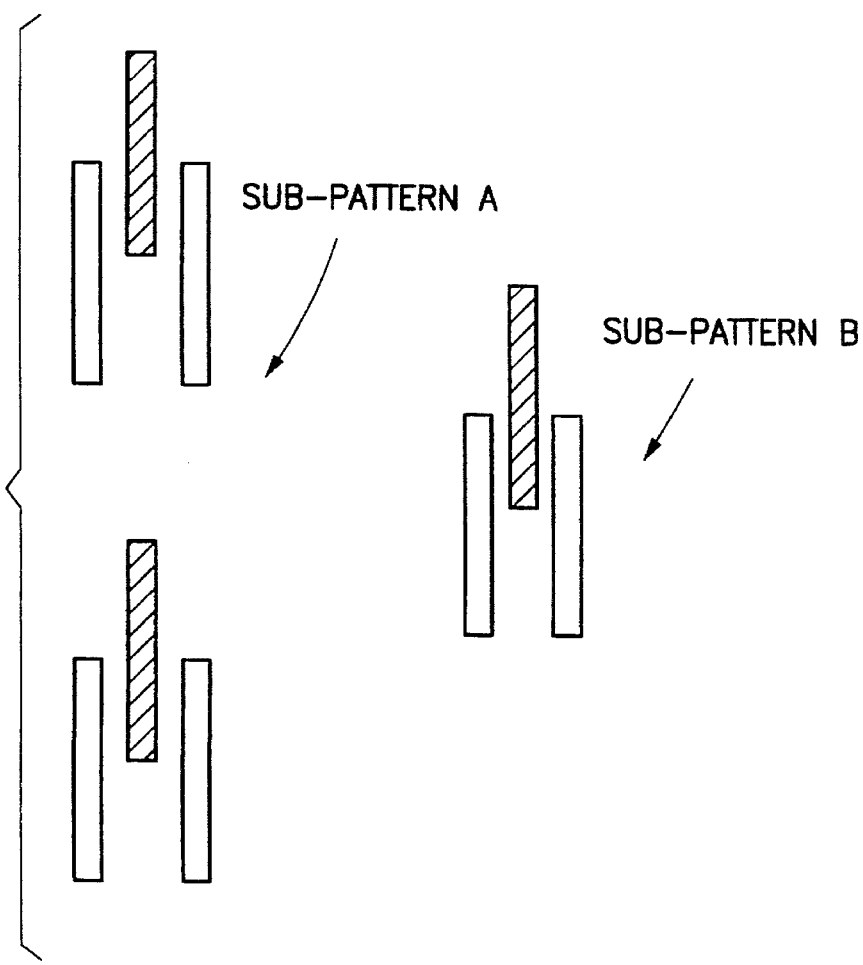

It should be noted that X conflicts on the X component pattern of FIG. 2 and Y conflicts in the Y component pattern of FIG. 3 are immaterial because the separation between elements in the same direction are usually not critical. There are some instances where the location of the edge at the end of feature is also critical. FIG. 9 shows a worse case situation where the alternating conflict at the end of the features cannot be resolved. This can be taken care of by splitting the pattern again into two sub-patterns as shown in FIG. 10. Sub-pattern A in FIG. 10 stays on the same mask substrate. Sub-pattern B can be combined with the other orthogonally split mask if no new conflict is introduced. Alternately, a third mask can be used to provide sub-pattern B. There can be as many as four masks if both the x and the y masks have critical unresolvable conflicts at feature ends. Combining the exposure of these three or four masks on the wafer follow the teachings given for superimposing the exposure of two masks.

Figure 4:
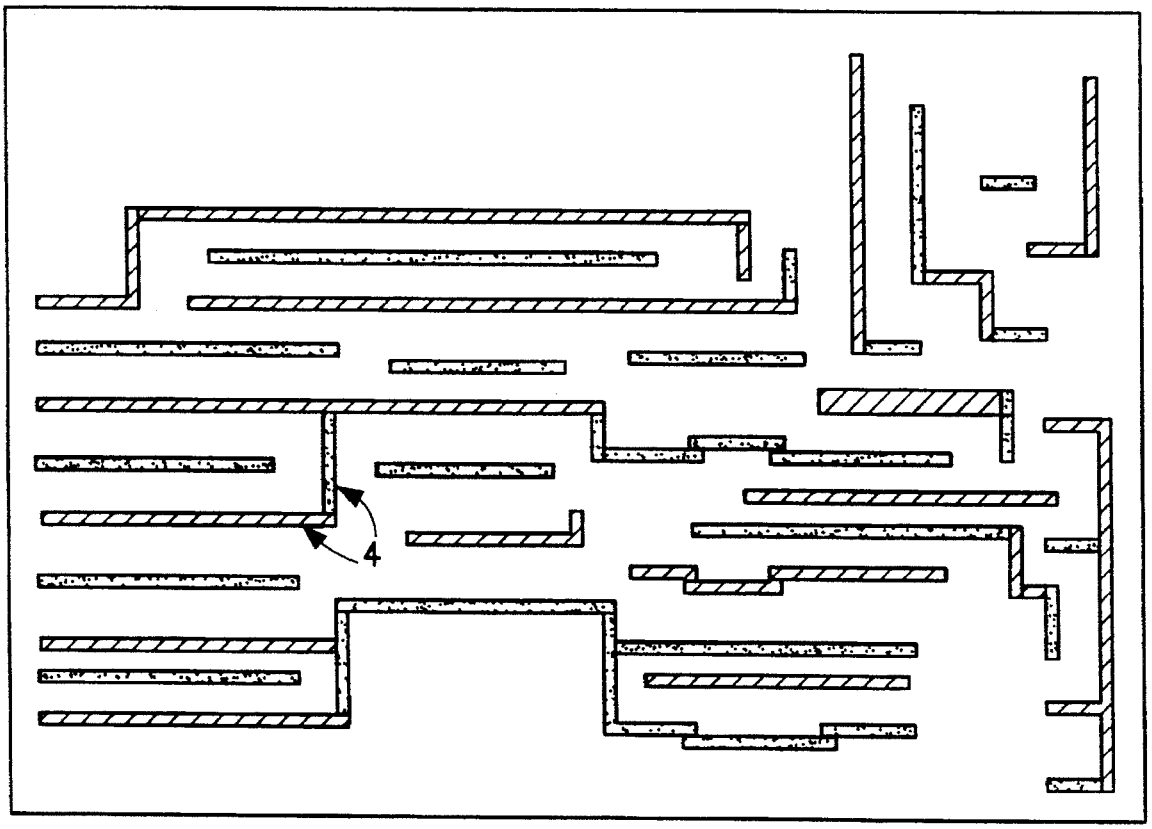
FIG. 4 is a schematic illustration of the X and Y direction components of FIGS. 2 and 3 recombined and superimposed.

FIG. 4 depicts the X components of the mask of FIG. 2 and the Y components of the mask of FIG. 3 recombined by superpositioning an X exposure and a Y exposure on a wafer.

Alternate to using separate superpositioned X and Y exposures, another step would be to use the same separation and shifting as shown in FIGS. 2 and 3, and to then combine the patterns into a single mask for exposure on the wafer. The single resultant mask would have the same pattern as shown in FIG. 4.

Figure 5:
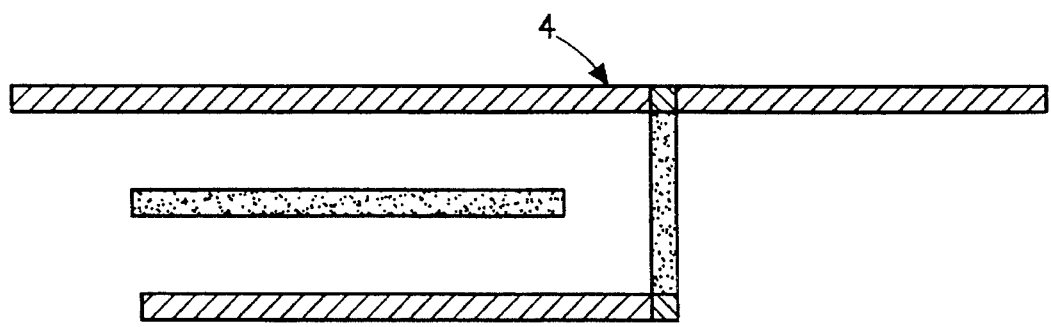
FIG. 5 is a schematic illustration of a portion of FIG. 4 including a π/2 phase shifts.

In the aforesaid single mask embodiment the conflicts are resolved, except that unwanted opaque lines due to the $\pi$ shifted edges have to be removed. They can be removed by introducing a $\pi/2$ region as shown in FIG. 5 which blows up a branch of element 4. A finer division into $\pi$ and 2 $\pi/3$ regions or a continuous transition between 0 and $\pi$ can also be used.

Figure 6:
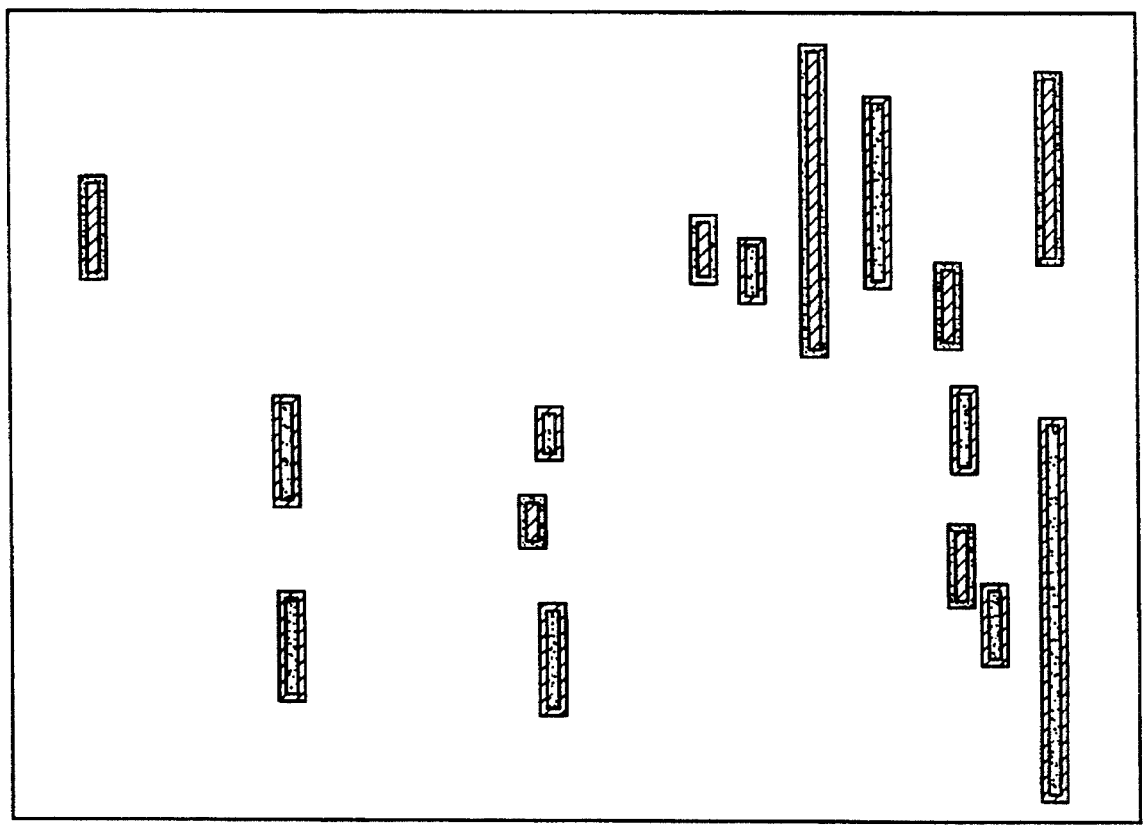
FIG. 6 is a schematic illustration of the alternately phase shifted Y components of FIG. 3 combined with RIM phase shift mask.

This orthogonal separation technique is further enhanced by combining with Att-Alt or rim-Alt structures. The y-component of a rim-Alt PSM is shown in FIG. 6.

Figure 7:
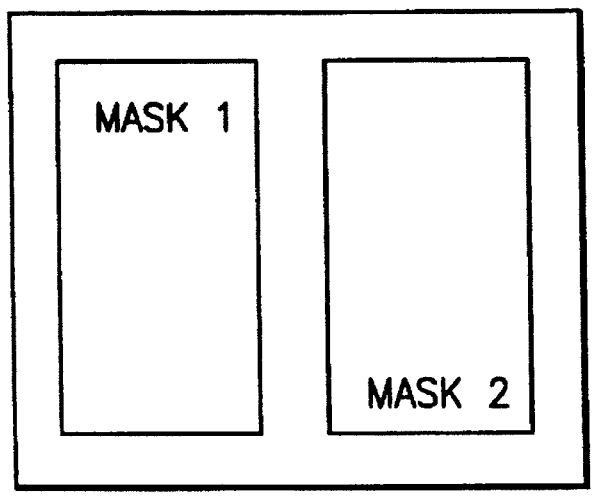
FIGS. 7 and 8 are schematic illustrations of two phase shifted masks fabricated on one single substrate with wafer exposures stepped at half-field intervals.
Figure 8:
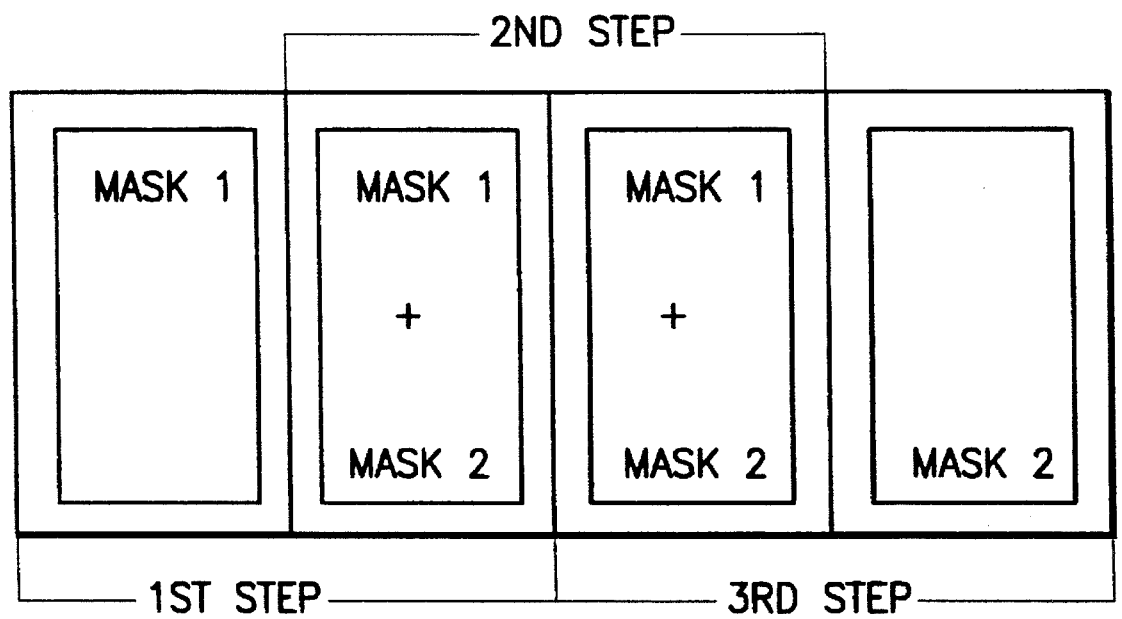

When using the first separate mask and separate exposure embodiment, a high overly accuracy of the two superimposed images can be achieved by doing one of the following:

With rectangular chip patterns, the two masks can be fabricated on one single substrate sharing the entire lens field as shown in FIG. 7. Wafer exposures are stepped at half-field intervals making the overlay accuracy only dependent on the stage precision which is in the order of 30 to 100 nm.

With two separate masks, the second exposure can be performed after the entire wafer is stepped but before the wafer is removed from its chuck.

Orthogonal separation into two exposures can improve imaging performance by itself even without phase shifting, because the interference of vertical and horizontal lines at corners and intersections is reduced from that caused by partial coherent illumination to an equivalent of incoherent illumination. This residual interference due to accumulation of exposure in the photoresist and is much less than the direct interference of vertical and horizontal lines on the same mask. In addition, the pattern density is reduced and imaging is limited to lines running in one direction, allowing a higher resolution.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

I claim:

1. A phase-shifting lithographic mask system having a plurality of component materials disposed in a pattern, including x-direction components and y-direction components, wherein said x-direction is orthogonal to said y-direction, and wherein said x-direction components and said y-direction components both include first non-phase-shifting components and second, π radian phase-shifting components, comprising a first mask layer including a first substantially transparent substrate wherein said first transparent substrate contains exclusively;

only said first x-direction components wherein said first non-phase-shifting x-direction components and said second π radians phase-shifting x-direction components are arranged alternately adjacent on said first transparent substrate;

a second phase-shifting mask layer including a second substantially transparent substrate wherein said second transparent substrate contains exclusively;

only said y-direction components wherein said first non-phase-shifting y direction components and said second π-radian phase shifting y-direction components are arranged alternately adjacent on said second transparent substrate.

2. A phase-shifting lithographic mask system according to claim 1 wherein said first and second substantially transparent substrates are combined and superimposed to form a composite lithographic mask having components arranged in said x and y direction.

3. A phase-shifting lithographic mask system according to claim 2 wherein at least one of said first and second phase-shifting mask layers includes a π/2 phase shifting component to eliminate opaque lines.

4. A phase-shifting lithographic mask system according to claim 1 wherein said x-direction mask components and said y-direction mask components are metal layers on said substrates having alternately unphase-shifted and π phase-shifted openings in said metal layer, said openings being in said x-direction and said y-direction respectively on said first and second mask layers.

5. A phase shifting lithographic mask system according to claim 4 wherein said first and second substantially transparent substrates are composed of quartz.

6. A phase-shifting lithographic mask system according to claim 5 wherein said metal layers are composed of chromium.

7. A phase-shifting lithographic mask system according to claim 4 wherein said alternately disposed x and y direction π phase-shifting openings include phase shifting absorbing material for shifting radiation by π radians.

8. A phase-shifting lithographic mask system according to claim 1 wherein at least one of said first and second phase shifting mask layers is a rim phase shift mask.

9. A phase-shifting lithographic mask system according to claim 1 wherein at least one of said first and second phase-shifting mask layers is an attenuated phase-shift mask.

10. A phase-shifting lithographic mask system according to claim 1 wherein at least one of said first and second phase-shifting mask layers is an alternative element phase-shift mask.

11. A phase-shifting lithographic mask system according to claim 1 further including at least one further phase-shifting mask layer including a substantially transparent substrate, said at least one further phase-shifting mask layer including a plurality of components selected from said x and y direction components.

12. A phase-shifting lithographic mask system according to claim 11 wherein said first, second and at least one further substantially transparent substrates are combined and superimposed to form a composite lithographic mask having components arranged in said x and y direction.

13. A method for fabricating a phase-shifting lithographic mask comprising the steps of:

forming on a first layer of transparent material a first plurality of non-phase-shifting components disposed on said first layer alternately adjacent with a first plurality of π radian phase shifting components, all of said components on said first layer of transparent material being disposed in a first linear direction and forming on a second layer of transparent material a second plurality of non-phase shifting components disposed on said second layer alternately adjacent with a second plurality of π radian phase shifting components, all of said components on said second layer of transparent material being disposed in a second linear direction orthogonal to said first linear direction.

14. A method for fabricating a phase-shifting lithographic mask according to claim 13 further including the step of:

combining and superimposing said first and second layers of transparent material to form a single composite lithographic mask having phase shifting components arranged in said first and second orthogonally disposed directions.

15. A method for fabricating a phase-shifting lithographic mask according to claim 13 further including the steps of sequentially:

the step of directing radiation through said first transparent layer having said first plurality phase-shifting components disposed thereon in said first direction, wherein said radiation passes through said first transparent layer onto a radiation sensitive wafer for lithographic exposure of a first pattern, and the step of directing radiation through said second transparent layer having said second plurality of phase-shifting components disposed thereon in said second direction wherein said radiation passes through said second transparent layer onto said wafer for lithographic exposure of a second pattern superimposed on said first pattern.

16. A method for fabricating a phase-shifting lithographic mask according to claim 13 wherein said phase-shifting components are formed by rim phase shift mask techniques.

17. A method for fabricating a phase-shifting lithographic mask according to claim 13 wherein said phase-shifting components are formed by alternative element shift mask techniques.

18. A method for fabricating a phase-shifting lithographic mask according to claim 13 wherein said phase-shifting components are formed by attenuated shift mask techniques.

19. A method for fabricating a phase-shifting lithographic mask according to claim 13 wherein said phase-shifting components are formed by hybrid attenuated, unattenuated alternate phase shift mask techniques.

20. A method for fabricating a phase-shifting lithographic mask according to claim 13 wherein said phase-shifting components are formed by hybrid rim unattenuated alternate phase shift mask techniques.

* * * * *